US010509628B1

(12) United States Patent
Babitsky et al.

(10) Patent No.: US 10,509,628 B1
(45) Date of Patent: Dec. 17, 2019

(54) SCALABLE-ENTRY FIFO MEMORY DEVICE

(71) Applicant: Marvell Israel (M.I.S.L.) Ltd., Yokne'am (IL)

(72) Inventors: Eliya Babitsky, Caesaria (IL); Yakov Tovar, Rishon LeZion (IL); Yaniv Azulay, Nes Ziona (IL); Moran Noiman, Kiryat Ono (IL)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 82 days.

(21) Appl. No.: 15/866,690

(22) Filed: Jan. 10, 2018

Related U.S. Application Data

(60) Provisional application No. 62/448,150, filed on Jan. 19, 2017.

(51) Int. Cl.
| G06F 5/16 | (2006.01) |
| G06F 5/08 | (2006.01) |
| G11C 7/10 | (2006.01) |

(52) U.S. Cl.
CPC ............. *G06F 5/16* (2013.01); *G06F 5/08* (2013.01); *G06F 2205/066* (2013.01); *G11C 7/10* (2013.01)

(58) Field of Classification Search
CPC ........ G06F 5/08; G06F 5/16; G06F 2205/066; G11C 7/10
See application file for complete search history.

(56) References Cited

U.S. PATENT DOCUMENTS

| 4,374,428 A * | 2/1983 | Barnes .................. G06F 15/167 711/100 |
| 4,592,019 A * | 5/1986 | Huang ....................... G06F 7/78 365/189.05 |
| 4,839,866 A * | 6/1989 | Ward ........................ G06F 5/10 365/189.08 |
| 5,036,489 A * | 7/1991 | Theobald .................. G06F 5/08 365/189.12 |
| 5,262,997 A * | 11/1993 | Lee ........................... G06F 5/10 365/189.04 |
| 6,115,760 A * | 9/2000 | Lo ............................ G06F 5/08 710/52 |
| 6,526,495 B1 * | 2/2003 | Sevalia ................... G06F 5/065 711/173 |
| 2005/0005082 A1 * | 1/2005 | Au ...................... G06F 12/0893 711/170 |
| 2006/0155940 A1 * | 7/2006 | Au .......................... G06F 5/065 711/154 |

* cited by examiner

*Primary Examiner* — Nimesh G Patel (57) ABSTRACT

A FIFO memory device has a first number of data storage units and a second number of internal FIFO memories. Each internal FIFO memory has a third number of internal data storage units. The first number is a product of the second and third numbers. A fourth number of data inputs receives input data units in order. Input multiplexer circuitry connects each one of the data inputs to any one of the internal FIFO memories, for storage of input data units, in order, in a first layer of the FIFO memory device including corresponding storage locations in respective ones of the internal FIFO memories. The first layer may be physical, or may be logical and maintained by pointers. Output multiplexer circuitry coupled to the internal FIFO memories connects each of the internal FIFO memories to any one of the data outputs to read out the stored data units in order.

20 Claims, 2 Drawing Sheets

SCALABLE-ENTRY FIFO MEMORY DEVICE

CROSS REFERENCE TO RELATED APPLICATION

This claims the benefit of commonly-assigned U.S. Provisional Patent Application No. 62/448,150, filed Jan. 19, 2017, which is hereby incorporated by reference herein in its entirety.

FIELD OF USE

This disclosure relates to a scalable-entry first-in, first-out (FIFO) memory device and a method of operating such a device.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

In a conventional FIFO memory device, data is written, stored, and read out in units of the same size, with only a single unit operated on at a time. In any particular implementation, the size of that data unit may differ from other implementations, and may be as small as one bit and as large as multiple bytes, but the data unit size is fixed and uniform.

Scalable-entry FIFOs also are known. In a scalable-entry FIFO, the data is stored in units of a certain size, each of which may be referred to as an "internal data unit." Data may be written to a scalable-entry FIFO in "input data units" which may have a maximum size of some integer multiple of the size of an internal data unit. Similarly, data may be read from a scalable-entry FIFO in "output data units" which may have a maximum size of some integer multiple of the size of an internal data unit. The integer multiple may be the same or different for the input data unit and the output data unit. The sizes of the input data unit and the output data unit are referred to as maximum sizes because, while those sizes are fixed at the time the scalable-entry FIFO is implemented, at run time a user may choose to input or output less data than the maximum size would permit.

Known scalable-entry FIFOs are implemented with a flat memory structure. Multiplexers are used to select the internal data unit locations corresponding to any input data unit or output data unit. Any internal data unit can receive any input data unit, and any output data unit can receive any internal data unit, leading to large multiplexers, resulting in large device areas and making it difficult to close timing.

SUMMARY

In an implementation of the subject matter of this disclosure, a first-in, first-out (FIFO) memory device, having a first number of data storage units, includes a plurality of internal FIFO memories equal in number to a second number, each internal FIFO memory in the plurality of internal FIFO memories having a third number of internal data storage units, the first number, which enumerates quantity of data storage units, being a product of the second number and the third number. A fourth number of data inputs is configured to receive input data units in an order of receipt. Input multiplexer circuitry selectively connects each one of the data inputs to any one of the internal FIFO memories, to direct respective ones of the input data units, received on the data inputs, for storage as stored data units, in the order of receipt, in a first layer of the FIFO memory device including corresponding storage locations in respective different ones of the internal FIFO memories.

In one such implementation, the first layer is physical. In another such implementation, the first layer is logical and is maintained by pointers, such that a new data unit to be pushed into the FIFO memory device is entered at a next available internal data unit of a next internal FIFO memory following an internal FIFO memory occupied by an immediately previous data unit pushed into the FIFO memory device.

One such implementation includes a fifth number of data outputs, and output multiplexer circuitry coupled to all of the internal FIFO memories for selectively connecting each one of the internal FIFO memories to one of the data outputs to read out the stored data units in the order of receipt as each stored data unit is pushed out of its respective internal FIFO memory.

In a variant of such an implementation, the output multiplexer circuitry includes a first multiplexer stage that selects a storage location in each respective one of the internal FIFO memories as a respective output of that respective one of the internal FIFO memories, and a second multiplexer stage that connects each respective output of each of the internal FIFO memories to one of the data outputs.

Such a variant may further include selection logic circuitry that maintains a pointer to one of the internal FIFO memories that stores a next data storage unit to be read out, the selection logic circuitry selecting that one of the internal FIFO memories for connection to a first one of the data outputs, and cyclically selecting additional ones of the internal FIFO memories for connection to additional ones of the data outputs to read out additional data units in order as the additional data units are pushed out.

Another such implementation may further include selection logic circuitry that maintains a pointer to one of the internal FIFO memories that stores a next data storage unit to be read out, the selection logic circuitry selecting that one of the internal FIFO memories for connection to a first one of the data outputs and cyclically selecting additional ones of the internal FIFO memories for connection to additional ones of the data outputs to read out additional data units in order as the additional data units are pushed out.

In another such implementation, the second number, which enumerates the internal FIFO memories, is equal to whichever of the fourth number, which enumerates the data inputs, and the fifth number, which enumerates the data outputs, is larger.

Another such implementation further includes selection logic circuitry that maintains a pointer to one of the internal FIFO memories to which a next input data unit is to be written, the selection logic circuitry selecting that one of the internal FIFO memories for connection to a first one of the data inputs and cyclically selecting additional ones of the internal FIFO memories for connection to additional ones of the data inputs to write additional data units to respective additional ones of the internal FIFO memories as the additional data units are pushed into the FIFO memory device.

In another such implementation, the FIFO memory device is clocked by a first clock signal having a first clock speed, the plurality of internal FIFO memories is clocked by a second clock signal having a second clock speed that is a multiple of the first clock speed, and the second number, which enumerates the internal FIFO memories, is equal to a quotient of (a) whichever of the fourth number, which enumerates the data inputs, and the fifth number, which enumerates the data outputs, is larger, and (b) the multiple.

Another implementation of the subject matter of this disclosure is a method of entering data into a first-in, first-out (FIFO) memory device having a first number of data storage units, the FIFO memory device comprising a plurality of internal FIFO memories equal in number to a second number, each FIFO memory in the plurality of internal FIFO memories having a third number of internal data storage units, the first number, which enumerates quantity of the data storage units, being a product of the second number and the third number. The method includes receiving data units, in an order of receipt, into ones of a fourth number of data inputs of the FIFO memory device, and using input multiplexer circuitry that is coupled to all of the internal FIFO memories to selectively connect each one of the data inputs to any one of the internal FIFO memories, entering the data from the data inputs as stored data units, in the order of receipt, in a first layer of the FIFO memory device including corresponding storage locations in respective different ones of the internal FIFO memories.

In one such implementation, the entering the data from the data inputs as stored data units, in the order of receipt, in corresponding storage locations in respective different ones of the internal FIFO memories, includes maintaining in selection logic circuitry a pointer to a next available internal data unit of a next one of the internal FIFO memories following an internal FIFO memory occupied by an immediately previous data unit pushed into the FIFO memory device, the next available internal data unit being a location to which a next input data unit is to be written, and selecting, using the selection logic circuitry, that one of the internal FIFO memories for connection to a first one of the data inputs and cyclically selecting additional ones of the internal FIFO memories for connection to additional ones of the data inputs to store additional data units in order as the additional data units are pushed into the FIFO memory device.

In another such implementation, the entering the data from the data inputs as stored data units, in the order of receipt, in corresponding storage locations in respective different ones of the internal FIFO memories, includes clocking the plurality of internal FIFO memories by a second clock signal having second clock speed, the second clock speed being a multiple of a first clock speed of a first clock signal by which the FIFO memory device is clocked, whereby a number of data units equal to a product of the second number and the multiple is entered during one clock cycle of the FIFO memory device.

In a variant of such an implementation, the receiving data units, in an order of receipt, into ones of the fourth number of data inputs of the FIFO memory device includes receiving data units at most equal in number to a product of the second number and the multiple.

In another such implementation, the receiving data units, in an order of receipt, into ones of the fourth number of data inputs of the FIFO memory device includes receiving data units at most equal in number to the second number.

Another implementation of the subject matter of this disclosure is a method of reading data from a first-in, first-out (FIFO) memory device having a first number of data storage units, the FIFO memory device comprising a plurality of internal FIFO memories equal in number to a second number, each internal FIFO memory in the plurality of internal FIFO memories having a third number of internal data storage units, the first number, which enumerates quantity of data storage units, being a product of the second number and the third number. The method includes using output multiplexer circuitry that is coupled to all of the internal FIFO memories to selectively connect any one of the internal FIFO memories to each data unit of a fourth number of data outputs, reading out stored data units from the internal FIFO memories as the stored data units are pushed out of the internal FIFO memories, to data outputs of the FIFO memory device, in an output order corresponding to an order in which the stored data units were received by the FIFO memory device.

In one such an implementation, the using output multiplexer circuitry includes using a first multiplexer stage to select a storage location in each respective one of the internal FIFO memories as a respective output of that respective one of the internal FIFO memories, using a second multiplexer stage to connect each respective output of each of the internal FIFO memories to one of the data outputs.

Such an implementation further includes maintaining, in selection logic circuitry, a pointer to one of the internal FIFO memories that stores a next data storage unit to be read out, and selecting, using the selection logic circuitry, that one of the internal FIFO memories following an internal FIFO memory formerly occupied by an immediately previous data unit pushed out of the FIFO memory device for connection to a first one of the data outputs, and cyclically selecting additional ones of the internal FIFO memories for connection to additional ones of the data outputs to read out additional data units in order as the additional data units are pushed out of the FIFO memory device.

One such implementation further includes maintaining, in selection logic circuitry, a pointer to one of the internal FIFO memories that stores a next data storage unit to be read out, and selecting, using the selection logic circuitry, that one of the internal FIFO memories following an internal FIFO memory formerly occupied by an immediately previous data unit pushed out of the FIFO memory device for connection to a first one of the data outputs, and cyclically selecting additional ones of the internal FIFO memories for connection to additional ones of the data outputs to read out additional data units in order as the additional data units are pushed out of the FIFO memory device.

In one such implementation, reading out stored data units from the internal FIFO memories, to data outputs of the FIFO memory device, includes clocking the plurality of internal FIFO memories by a second clock signal having second clock speed, the second clock speed being a multiple of a first clock speed of a first clock signal by which the FIFO memory device is clocked, whereby a number of data units equal to a product of the second number and the multiple is read out during one clock cycle of the FIFO memory device.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, in a conventional FIFO memory device, data is written, stored, and read out in units of the same size. In addition, scalable-entry FIFO memory devices also are known, in which every read or write operation can be of a different size (up to a predetermined maximum size).

However, in the known scalable-entry FIFO memory devices, the internal storage of the FIFO memory device is a flat array of data units in which any of the internal data units can receive any input data unit, and any output data unit can receive any internal data unit. This leads to very large multiplexers, or at least to a substantial amount of device area devoted to multiplexers, even if the individual multiplexers are not overly large.

For example, on the input side, there might be a number of multiplexers equal to the total number of internal data units, with each of those multiplexers having a number of inputs equal to the maximum input data width to be permitted. Similarly, on the output side, there might be a number of multiplexers equal to the maximum output data width to be permitted, with each of those multiplexers having a number of inputs equal to the total number of internal data units. In practice, while the number of input data units and output data units may be relatively small, the number of internal data units can be in the tens, hundreds or more, leading to large numbers of multiplexers on the input side and large multiplexers on the output side.

In addition, each internal data unit has its own "sample enable" condition, which is a function of its index, the current write pointer and the number of data units being written. That function can also consume substantial resources.

In accordance with implementations of the subject matter of this disclosure, the number and sizes of multiplexers are limited by dividing the internal storage of the FIFO memory device into a number of internal FIFO memory devices. Each internal FIFO memory device is implemented using any suitable FIFO technology, including simple structures such as shift registers, or more complex structures, including smaller implementations of the subject matter of this disclosure.

As described in more detail below, on the input side, data units are entered in ordered fashion from the input data storage units to the inputs of the internal FIFO memory devices. For example, in at least one implementation, input multiplexer circuitry includes individual input multiplexers that allow selected ones of the input data units to be connected to selected ones of the internal FIFO memory devices in an any-to-any coupling arrangement.

In implementations of the subject matter of this disclosure, the input data units are selectably connected, via the input multiplexer circuitry, to the inputs of the internal FIFO memory devices, in cyclical, round-robin fashion. In other words, in an implementation, an input data unit is pushed into the first logical row of the input end of a respective one of the internal FIFO memory devices. Each subsequent input data unit is input into the same logical row of another internal FIFO memory device that is selected in round-robin fashion until an entire set of input data units is pushed into that logical row of one or more of the internal FIFO memory devices. In some embodiments, each data unit is of the same size as each internal data unit of the internal FIFO devices, while in other embodiments, each input data unit may be of a smaller size than the size of each internal data unit. Input multiplexer control logic keeps track of which of the input data units should be read from next, and which of the internal FIFO memory devices should be written to next, and generates selection signals for the individual input multiplexers to connect, via the correct one of the individual input multiplexers, one of the input data units to one of the internal FIFO memory devices.

As discussed further below, the maximum permitted number of input data units is at most equal to the number of internal FIFO memory devices in an implementation in which the number of internal FIFO memory devices is equal to the maximum number of output data units. In addition, in that implementation and other implementations, in any particular write transaction (or "push"), the number of input data units actually used could be less than the maximum number of input data units. The input multiplexer control logic accounts for both of those conditions, connecting the correct input data unit to the correct internal FIFO memory device.

Within the internal FIFO memory devices, the input order is maintained, with data units entered on different inputs being stored in corresponding locations of different ones of the internal FIFO memory devices so that, at least logically, a group of input data units appearing together at the inputs of the scalable entry FIFO memory device is stored across one logical row or layer of the scalable entry FIFO memory device. Alternatively, if the number of input data units input in a previous transaction was smaller than the maximum number of input data units, a current group of input data units could be stored across a portion at the end of one row or layer and another portion at the beginning of the following row or layer. That is, a new data unit is pushed into the scalable-entry FIFO memory device at a next internal FIFO memory device following the last internal FIFO memory device occupied by an immediately previous data unit pushed into the scalable-entry FIFO memory device.

In some implementations that row or layer is a first physical row or layer across the internal FIFO memory devices, with each input transaction pushing the data entered in the previous transaction into the next row. In other implementations, that row or layer is a "first" logical row or layer, indicated by a set of pointers to the next available individual internal data unit of each respective one of the various internal FIFO memory devices, and that set of pointers is moved after each input transaction to the new set of next available internal data units.

On the input side, the number of multiplexers provided is equal to the number of internal FIFO memory devices, with each respective multiplexer having one output (for input to its respective internal FIFO memory device), and having a number of inputs equal to the maximum possible number of input data units.

On the output side, data units are output in ordered fashion from the outputs of the internal FIFO memory devices to the individual output data units. For example, in at least one implementation, output multiplexer circuitry includes individual output multiplexers that allow selected ones of the output data units to be connected to selected ones of the internal FIFO memory devices in an any-to-any coupling arrangement. As discussed further below, in any particular read transaction (or "pop"), the number of output data units actually used could be less than the maximum number of output data units, which may differ from the number of internal FIFO memory devices in an implementation in which the number of internal FIFO memory devices is equal to the maximum number of input data units. The output multiplexer control logic accounts for both of those conditions, connecting the correct output data unit to the correct internal FIFO memory device.

In implementations of the subject matter of this disclosure, the output data units are selectably connected, via the output multiplexer circuitry, to the outputs of the internal FIFO memory devices, in cyclical, round-robin fashion. Output multiplexer control logic keeps track of which of the output data units should be written to next, and generates selection signals for the individual output multiplexers to connect, via the correct one of the individual output multiplexers, one of the output data units to one of the internal FIFO memory devices.

There are at least two possible implementations for the arrangement of the output multiplexer circuitry. According to one possible implementation, each internal FIFO memory device is a shift register or similar circuitry in which each data unit automatically advances from one position to the next as new data units are entered at the input, eventually being output at the output. In such an implementation, each output multiplexer has an input from each of the internal FIFO memory devices, and each output data unit receives the output of one of the output multiplexers. Thus, the number of output multiplexers in the output multiplexing circuitry is equal to the maximum possible number of output data units (as in the input multiplexing circuitry), and the number of inputs of each output multiplexer corresponds to the number of internal FIFO memory devices.

According to another possible implementation, the elements of each internal FIFO memory device are randomly accessible and are themselves used in round-robin fashion, with control logic keeping track of the next element to be read from (and, although not referred to above in connection with the input side, also keeping track of the next element to be written to). In such an implementation, the number of internal FIFO memory elements to be connected to the output data units is the same as in the previously known structures described above. However, to reduce the size of the output multiplexer circuitry, the output multiplexer circuitry is divided into two stages.

The second stage is identical to the output multiplexer circuitry of the previous possible implementation, with one second stage multiplexer corresponding to each output data unit, and each multiplexer having a number of inputs equal to the number of internal FIFO memory devices. The first stage includes one first stage multiplexer for each of the internal FIFO memory devices. Each first stage multiplexer has a number of inputs equal to the number of internal data units in its respective internal FIFO memory device. The first stage multiplexers select the aforementioned corresponding storage locations in different ones of the internal FIFO memory devices to read out data in the order in which it was input.

Thus, the total number of output multiplexers in the output multiplexer circuitry according to the first possible implementation is equal to the maximum number of output data units, with each output multiplexer having a number of inputs equal to the number of internal FIFO memory devices. The number of output multiplexers according to the second possible implementation is the sum of the maximum number of output data units and the number of internal FIFO memory devices, with each of the first stage output multiplexers having a number of inputs equal to the number of internal data units in each internal FIFO memory device, and each of the second stage output multiplexers having a number of inputs equal to the number of internal FIFO memory devices.

In either possible implementation, at least logically, a group of output data units appearing together at the outputs of the scalable entry FIFO memory device was stored across one logical row or layer of the scalable entry FIFO memory device. Alternatively, if the number of output data units output in a previous transaction was smaller than the maximum number of output data units, a current group of output data units could be stored across a portion at the end of one row or layer and another portion at the beginning of the following row or layer.

Either possible implementation compares favorably in terms of device area to the previously known structures in which the number of output multiplexers was equal to the maximum number of output data units, and each output multiplexer had a number of inputs equal to the total number of internal data units, which resulted in very large multiplexers.

To generalize, the number and size of multiplexers in implementations of the subject matter of this disclosure are reduced compared to previous scalable-entry FIFO structures by having the input data units and output data units connected only to the inputs, or the outputs, respectively, of the internal FIFO memory devices, rather than to all of the individual internal data units. In order to maintain first-in, first-out behavior, input data units are distributed in round-robin fashion to corresponding locations in the different internal FIFO memory devices, and output data units are read in round-robin fashion from the corresponding locations in the different internal FIFO memory devices. Control circuitry generates the appropriate selection signals to cause that to happen.

The control circuitry keeps track of which of the internal FIFO memory devices should be written to or read from next. The identification of the next internal FIFO memory device to be read from may be thought of as a read pointer, which the identification of the next internal FIFO memory device to be written to may be thought of as a write pointer. Similarly, in the second possibility described above, where the elements of each internal FIFO memory device are randomly accessible, the identification of the next internal FIFO memory device element to be read from may be thought of as a read pointer, which the identification of the next internal FIFO memory device element to be written to may be thought of as a write pointer.

A scalable entry FIFO may be characterized by the following parameters:

DATA_UNIT_SIZE=Size of a single data unit (e.g., in bits). This can be any value, including a value as small as one bit, meaning that the read/write unit can be any size from one bit up.

WR_WIDTH=Width of write data (in data units). Maximum number of data units that can be written at once for a given implementation, although for any particular write transaction, the number of data units may be smaller.

RD_WIDTH=Width of read data (in data units). Maximum amount of data units that can be read at once for a given implementation, although for any particular write transaction, the number of data units may be smaller.

FIFO_SIZE=Size of the overall FIFO structure (in data units)

In accordance with the discussion above, data units are input to only to a first "layer" of the internal storage—i.e., to a "row" of corresponding respective elements of each of the internal FIFO memory devices. Similarly, data units are output only from a last "layer" of the internal storage—i.e., from the "row" of corresponding respective elements of each of the internal FIFO memory devices. Multiplexing circuitry and logic therefore is provided only between the input data units and the "first row," and between the "last row" and the output data units. As discussed, the first and last layers or rows may be physical rows, or may be logical rows designated by pointers generated in selection logic.

The internal FIFO memory devices can be characterized by the number of internal FIFO memory devices needed (FIFO Number) and the depth of each internal FIFO memory device (FIFO Depth):

FIFO_Number=max(WR_WIDTH, RD_WIDTH); i.e., the number of internal FIFO memory devices is the larger of the number of write data units and the number of read data units (which may be the same). That is why, as noted above, either the maximum number of input data units or the maximum number of output data units will be less than FIFO_Number, unless the maximum number of input data units and the maximum number of output data units are the same.

FIFO_Depth=ceil(FIFO_SIZE/FIFO_Number); i.e., the number of memory elements in each of the internal FIFO memory devices is the quotient of the total number of memory elements in the overall FIFO structure, and the number of internal FIFO memory devices, rounded up to the next integer.

In some implementations, the internal FIFO memory devices may be overclocked by a factor n relative to the overall FIFO device. In such an implementation, FIFO_Number=(max(WR_WIDTH,RD_WIDTH))/*n*

This allows more input/output data units for the same number of internal FIFO memory devices. That is, on each clock cycle, n layers or rows of the internal FIFO memory devices may be pushed or popped, so that the maximum input or output data width would be n×FIFO Number data units.

Similarly, the multiplexer requirements are reduced as compared to known scalable-entry FIFO structures, as discussed above. The number of input multiplexers is reduced from FIFO_SIZE to FIFO_Number. The width of each input multiplexer is unchanged at WR_WIDTH (even in overclocking implementations, the input multiplexer width is unchanged; the input multiplexer is simply used n times as often.

The width of each multiplexer in the final stage of output multiplexers is reduced from FIFO_SIZE to FIFO_Number. Even if a first stage of output multiplexers is required as discussed above, only FIFO_Number of such first stage output multiplexers is needed, and each first stage output multiplexer has a width of FIFO_Depth. Thus, instead of RD_WIDTH output multiplexers of width FIFO_SIZE, there are RD_WIDTH output multiplexers of width FIFO_Number (second, or final, stage), and possibly FIFO_Number additional output multiplexers of width FIFO_Depth (first stage).

If the internal FIFO memory devices are overclocked by a factor n as described above, then the output multiplexers must also be overclocked by n so that the data can be read out fast enough but, as in the case of the input multiplexers, the number and size of the output multiplexers is not changed by overclocking.

Figure 1:
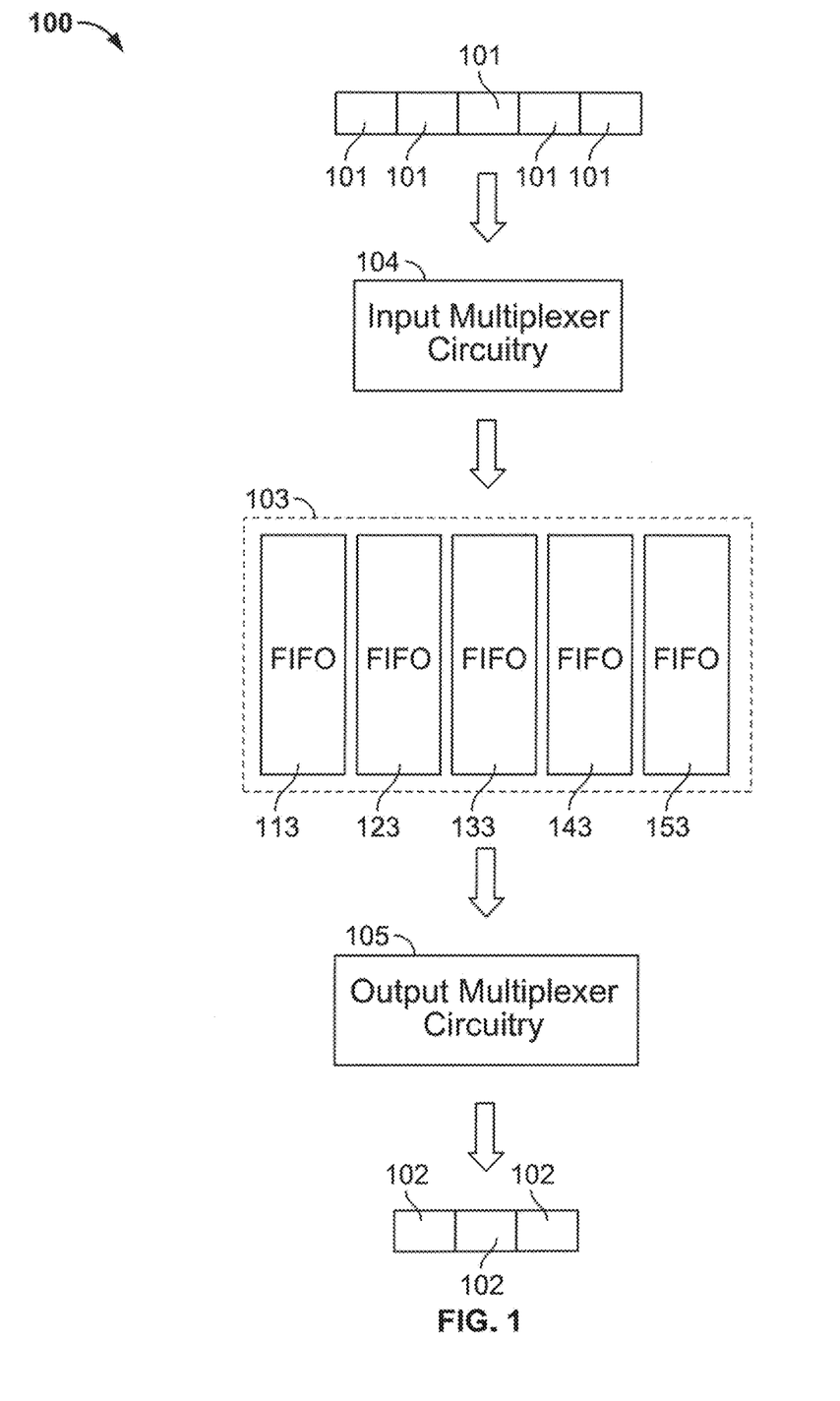
FIG. 1 is a high-level diagram of a scalable-entry FIFO memory device according to an implementation of the subject matter of this disclosure.
Figure 2:
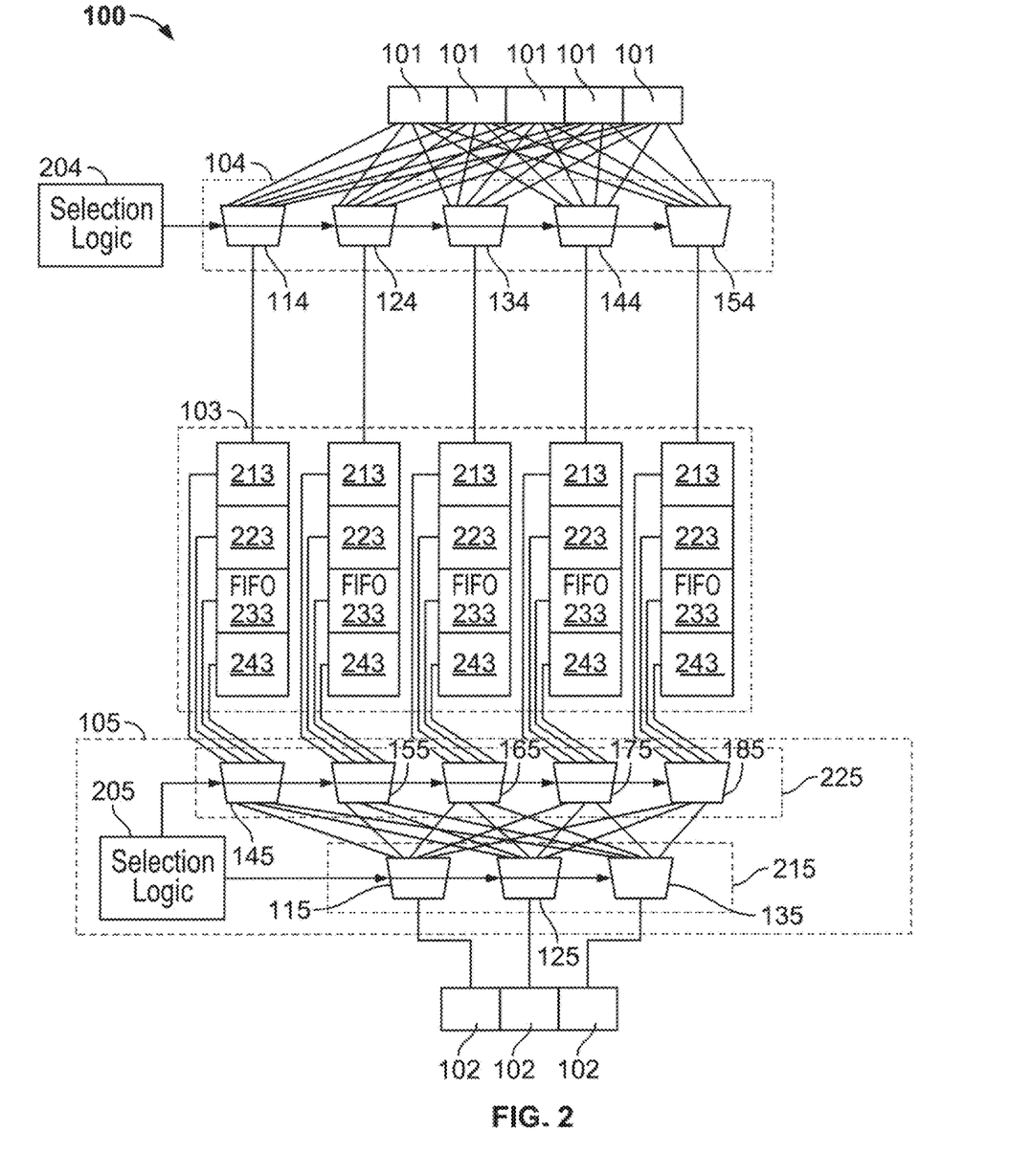
FIG. 2 is a more detailed diagram of the scalable-entry FIFO memory device of FIG. 1.

An example of a FIFO structure 100 having a capacity twenty-four data units is shown in FIGS. 1 and 2, although in most actual implementations, the number of data units would be substantially larger.

Referring now to FIGS. 1 and 2, FIFO structure 100 accepts a maximum of five data inputs 101. Although drawn as structures, which may exist, for example, as registers, data inputs 101 more likely are simple connections to upstream components in a larger circuit of which FIFO structure 100 is a part. Thus data inputs 101 may be, e.g., conductors in a bus having a width of WR_WIDTH conductors, each of which has a width of DATA_UNIT_SIZE bits, so that the full bus input bus width is DATA_UNIT_SIZE×WR_WIDTH. In any data input transaction, the actual number of data units may be up to the number of data inputs 101—i.e., in any given transaction, some of the data inputs 101 may go unused. Moreover, although FIG. 1 shows five data inputs 101, that number is only an example, and it is within the scope of this disclosure to have any number of data inputs 101.

FIFO structure 100 outputs a maximum of three data outputs 102. Although drawn as structures, which may exist, for example, as registers, data outputs 102 more likely will be simple connections to downstream components in a larger circuit of which FIFO structure 100 is a part. Thus data outputs 102 may be, e.g., conductors in a bus having a width of RD_WIDTH conductors, each of which has a width of DATA_UNIT_SIZE bits, so that the full bus output bus width is DATA_UNIT_SIZE×RD_WIDTH. In any data output transaction, the actual number of data units may be up to the number of data outputs 102—i.e., in any given transaction, some of the data outputs 102 may go unused. Moreover, although FIG. 1 shows three data outputs 102, that number is only an example, and it is within the scope of this disclosure to have any number of data outputs 102.

Internal storage 103 of FIFO structure 100 includes five internal FIFO memory devices 113, 123, 133, 143, 153. As shown in FIG. 2, each of internal FIFO memory devices 113, 123, 133, 143, 153 stores four internal data storage units 213, 223, 233, 243. Although five internal FIFO memory devices are shown, that number is just an example, and it is within the scope of this disclosure to have any number of internal FIFO memory devices, although as a practical matter, to achieve the desired result of avoiding overly large multiplexers, or overly numerous multiplexers, the number of internal FIFO memory devices may be expected to remain relatively small. On the other hand, while four internal data storage units are shown in each internal FIFO memory device, that number is just an example and the actual number of internal data storage units in each internal FIFO memory device may be expected to be substantially larger than four. Indeed, to keep the required number and size of multiplexers relatively small, as noted above the number of internal FIFO memory devices is limited to the larger of RD_WIDTH and WR_WIDTH. However, each internal FIFO memory device could have thousands of data units each (as could be the case if they were implemented, for example, with RAM-based FIFOs).

The width of each internal data storage unit 213, 223, 233, 243 determines the maximum size of an input data unit or an output data unit. In some implementations, the width of each internal data storage unit 213, 223, 233, 243 is configurable to any desired number of bits or bytes up to a maximum determined for a given implementation.

Input multiplexer circuitry 104 connects data inputs 101 to internal FIFO memory devices 113, 123, 133, 143, 153. As shown in FIG. 2, input multiplexer circuitry 104 includes input multiplexers 114, 124, 134, 144, 154, equal in number to the number of internal FIFO memory devices 113, 123, 133, 143, 153, and each having a number of inputs equal in number to the number of data inputs 101. As described in more detail below, input multiplexer circuitry 104 connects data inputs 101 to internal FIFO memory devices 113, 123, 133, 143, 153 in the round-robin manner described above, under control of input selection logic circuitry 204.

Output multiplexer circuitry 105 connects internal FIFO memory devices 113, 123, 133, 143, 153 to data outputs 102. As shown in FIG. 2, a final stage 215 of output multiplexer circuitry 105 includes output multiplexers 115, 125, 135, equal in number to the number of data outputs, and each having a number of inputs equal in number to the number of internal FIFO memory devices. As described in more detail below, output multiplexers 115, 125, 135 connect internal FIFO memory devices 113, 123, 133, 143, 153 to data outputs 102 in the round-robin manner described above, under control of output selection logic circuitry 205.

As also described above, final stage 215 would be the only stage of output multiplexer circuitry 105 if internal FIFO memory devices 113, 123, 133, 143, 153 were shift registers, or some other technology in which data units can be entered at one end and step through the memory device one position at a time until they reach the other end. However, with other technologies, in which the data units in internal FIFO memory devices 113, 123, 133, 143, 153 are randomly accessible, the FIFO character of the devices is maintained by providing appropriate multiplexing to access the correct data unit at the correct time. That appropriate multiplexing may be provided by a second output multiplexer stage 225 having output multiplexers 145, 155, 165, 175, 185.

Although shown as separate elements, in some implementations the input selection logic circuitry 204 and the output selection logic circuitry 205 are one selection logic circuitry element. In any case, input selection logic circuitry 204 and output selection logic circuitry 205 together keep track of pointers to the next location to be written to or read from, in accordance with the following protocol, in which A and B refer, in either order, to the FIFO and its client (i.e., the circuit element that is the source or destination of the FIFO data):

1. When A is ready to receive data it asserts signal A2B_ready_ (without regarding ANY signal from B). It also drives a valid value to A2B_rdy_size (without regarding ANY signal from B).
2. When B has data to forward to A, it drives a valid data on the B2A_data bus and asserts B2A_load_ (without regarding ANY signal from A). It also drives a valid value to B2A_load_size (without regarding any signal from A).
3. A data transaction is performed when BOTH A2B_ready_ AND B2A_load_ are active and B2A_load_size≤A2B_ready_size. Otherwise, there will be no transaction of data at all.

The following variables may be defined, where C log b2(X) returns the number of bits required to represent X. For example, C log b2 (4)=3 (4=3'b100):

| Dir | Name | Width | Polarity | Description |
|---|---|---|---|---|
| | External Parameters (must be provided by the user at module instantiation) | | | |
| N/A | WR_WIDTH | N/A | N/A | Width of the data_in bus (in data units) WR_WIDTH must be ≤ALIGNER_SIZE |
| N/A | RD_WIDTH | N/A | N/A | Width of the data_out bus (in data units) RD_WIDTH must be ≤ALIGNER_SIZE |
| N/A | ALIGNER_SIZE | N/A | N/A | Number of data units in memory |
| N/A | DATA_UNIT_SIZE | N/A | N/A | Size of a data unit in bits |
| | General | | | |
| In | clk | 1 | N/A | Clock signal |
| In | rst_ | 1 | AL | Async reset signal Must be asserted at the beginning to initialize FIFO |
| | Write interface | | | |
| In | wr_cl2fifo_data | WR_WIDTH*DATA_UNIT_SIZE | N/A | Data from write client. Note: wr_cl2fifo_data size is WR_WIDTH, which is the maximum number of bits that can be written; only the wr_cl2fifo_load_size data units that actually have data in them are written to memory The other data units are ignored |
| In | wr_cl2fifo_load_ | 1 | AL | Load signal from write client Goes together with wr_cl2fifo_load_size |
| In | wr_cl2fifo_load_size | Clogb2(WR_WIDTH) | N/A | Number of data units to load from write client Goes together with wr_cl2fifo_load_ Must be TAHR WIDTH |

-continued

| Dir | Name | Width | Polarity | Description |
|---|---|---|---|---|
| Out | fifo2wr_cl_rdy_ | 1 | AL | FIFO is ready to receive data from write client. Might be de-asserted only after load is active. Goes together with fifo2wr_cl_rdy_size |
| Out | fifo2wr_cl_rdy_size | Clogb2(WR_WIDTH) | N/A | FIFO is ready to receive up to fifo2wr_cl_rdy_size data units from write client. May decrease only after load. Goes together with fifo2wr_cl_rdy_. |
| Read interface | | | | |
| Out | fifo2rd_cl_data | RD_WIDTH*DATA_UNIT_SIZE | N/A | Data from FIFO. Note: fifo2rd_cl_data size is RD_WIDTH, which is the maximum number of bits that can be read; which only the rd_cl2fifo_rdy_size data units that actually have data in them are valid |
| Out | fifo2rd_cl_load_ | 1 | AL | Load signal from FIFO Goes together with fifo2rd_cl_load_size |
| Out | fifo2rd_cl_load | Clogb2 (RD_WIDTH) | N/A | Number of data units to size load from FIFO Goes together with fifo2rd_cl_load |
| In | rd_cl2fifo_rdy_ | 1 | AL | Read client is ready to receive data from FIFO Might be de-asserted only after load is active Goes together with rd_cl2fifo_rdy_size |
| In | rd_cl2fifo_rdy_size | Clogb2 (RD_WIDTH)) | N/A | Read client is ready to receive up to rd_cl2fifo_rdy_size data units from FIFO Goes together with rd_cl2fifo_rdy_ Must be ≤RD_WIDTH |

With the foregoing in mind, one can define two internal signals, fifo_push and fifo_pop, to keep track of when a "push" (or "enqueue") or "pop" (or "dequeue") transaction has occurred:

fifo_push=(wr_cl2fifo_load is asserted) AND (fifo2wr_cl_rdy_ is asserted) AND (fifo2wr_cl_rdy_size≥wr_cl2fifo_load_size)

fifo_pop=(fifo2rd_cl_load_ is asserted) AND (rd_cl2fifo_rdy_ is asserted) AND (fifo2rd_cl_load_size≥rd_cl2fifo_rdy_size)

A write pointer (wr_ptr) and a read pointer (rd_ptr) are maintained by the selection logic circuitry—e.g., in flip-flops.

The write pointer is advanced only if fifo_push is asserted:

At each clock edge:
if (fifo_push)
wr_ptr next value=(wr_ptr current value+ wr_cl2fifo_load_size) % MAX_WIDTH;
else
wr_ptr keeps its current value Similarly, the read pointer is advanced only if fifo_pop is asserted:

At each clock edge:
if (fifo_pop)
rd_ptr next value=(rd_ptr current value+ rd_cl2fifo_rdy_size) % MAX_WIDTH
else
rd_ptr keeps its current value The pointers are modulo(MAX_WIDTH) so they cycle from the last position back to the first position.

The selection signal for the $i^{th}$ input mux is:

For (i=0 . . . MAX_WIDTH−1)
select[(i+wr_ptr) % MAX_WIDTH]=i % WR_WIDTH

And the selection signal for the $j^{th}$ output mux is:

For (j=0 . . . RD_WIDTH−1)
select[j]=(j+rd_ptr) % MAX_WIDTH

Input selection logic circuitry 204 and output selection logic circuitry 205, whether they exist as one element or separate elements, may be circuitry that is hard-wired to implement the selection logic described above, or may be respective microcontroller circuitry or microprocessor circuitry configured to execute the selection logic described above.

Thus it is seen that a scalable-entry FIFO, in which the number and sizes of multiplexers are limited by dividing the internal storage of the FIFO memory device into a number of internal FIFO memory devices, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A first-in, first-out (FIFO) memory device having a first number of data storage units, the FIFO memory device comprising:
a plurality of internal FIFO memories equal in number to a second number, each internal FIFO memory in the plurality of internal FIFO memories having a third number of internal data storage units in individual storage locations, the first number, which enumerates quantity of data storage units, being a product of the second number and the third number;
a fourth number of data inputs configured to receive input data units in an order of receipt; and
input multiplexer circuitry for selectively connecting each one of the data inputs to any one of the internal FIFO memories, to direct respective ones of the input data units, received on the data inputs, in round-robin fashion for storage as stored data units, in the order of receipt, in a first layer of the FIFO memory device defined by corresponding ones of the individual storage locations distributed across respective different ones of the internal FIFO memories.

2. The FIFO memory device of claim 1 wherein:
the first layer is a physical layer that is defined by:
the individual storage locations in each of the internal FIFO memories being ordered; and
the corresponding ones of the individual storage locations, that are distributed across respective different ones of the internal FIFO memories, being respective identically-ordered storage locations in each respective one of the internal FIFO memories.

3. The FIFO memory device of claim 1 wherein:
each new data unit to be pushed into the FIFO memory device is entered into a next internal FIFO memory following an internal FIFO memory occupied by an immediately previous data unit pushed into the FIFO memory device; and
the first layer is a logical layer defined by pointers directing each new data unit to a next available internal data unit of the next internal FIFO memory.

4. The FIFO memory device of claim 1 further comprising:
a fifth number of data outputs; and
output multiplexer circuitry coupled to all of the internal FIFO memories for selectively connecting each one of the internal FIFO memories to one of the data outputs to read out the stored data units in round-robin fashion across the internal FIFO memories in the order of receipt as each stored data unit is pushed out of its respective internal FIFO memory.

5. The FIFO memory device of claim 4 wherein the output multiplexer circuitry comprises:
a first multiplexer stage that selects a respective one of the individual storage locations in each respective one of the internal FIFO memories as a respective output of that respective one of the internal FIFO memories; and
a second multiplexer stage that connects each respective output of each of the internal FIFO memories, as selected by the first multiplexer stage, to one of the data outputs.

6. The FIFO memory device of claim 5 further comprising selection logic circuitry that maintains a pointer to one of the internal FIFO memories that stores a next data storage unit to be read out, the selection logic circuitry selecting that one of the internal FIFO memories for connection to a first one of the data outputs, and cyclically selecting additional ones of the internal FIFO memories for connection to additional ones of the data outputs to read out additional data units in order as the additional data units are pushed out.

7. The FIFO memory device of claim 4 further comprising selection logic circuitry that maintains a pointer to one of the internal FIFO memories that stores a next data storage unit to be read out, the selection logic circuitry selecting that one of the internal FIFO memories for connection to a first one of the data outputs and cyclically selecting additional ones of the internal FIFO memories for connection to additional ones of the data outputs to read out additional data units in order as the additional data units are pushed out.

8. The FIFO memory device of claim 4 wherein the second number, which enumerates the internal FIFO memories, is equal to whichever of the fourth number, which enumerates the data inputs, and the fifth number, which enumerates the data outputs, is larger.

9. The FIFO memory device of claim 1 further comprising selection logic circuitry that maintains a pointer to one of the internal FIFO memories to which a next input data unit is to be written, the selection logic circuitry selecting that one of the internal FIFO memories for connection to a first one of the data inputs and cyclically selecting additional ones of the internal FIFO memories for connection to additional ones of the data inputs to write additional data units to respective additional ones of the internal FIFO memories as the additional data units are pushed into the FIFO memory device.

10. The FIFO memory device of claim 1 wherein:
the FIFO memory device is clocked by a first clock signal having a first clock speed;
the plurality of internal FIFO memories is clocked by a second clock signal having a second clock speed that is a multiple of the first clock speed; and
the second number, which enumerates the internal FIFO memories, is equal to a quotient of (a) whichever of the fourth number, which enumerates the data inputs, and the fifth number, which enumerates the data outputs, is larger, and (b) the multiple.

11. A method of entering data into a first-in, first-out (FIFO) memory device having a first number of data storage units, the FIFO memory device comprising a plurality of internal FIFO memories equal in number to a second number, each FIFO memory in the plurality of internal FIFO memories having a third number of internal data storage units in individual storage locations, the first number, which enumerates quantity of the data storage units, being a product of the second number and the third number, the method comprising:
receiving data units, in an order of receipt, into ones of a fourth number of data inputs of the FIFO memory device; and
using input multiplexer circuitry that is coupled to all of the internal FIFO memories to selectively connect each one of the data inputs to any one of the internal FIFO memories, entering the data from the data inputs in round-robin fashion as stored data units, in the order of receipt, in a first layer of the FIFO memory device defined by corresponding ones of the individual storage locations distributed across respective different ones of the internal FIFO memories.

12. The method of claim 11 wherein the entering the data from the data inputs as stored data units, in the order of receipt, in corresponding storage locations in respective different ones of the internal FIFO memories comprises:

maintaining in selection logic circuitry a pointer to a next available internal data unit of a next one of the internal FIFO memories following an internal FIFO memory occupied by an immediately previous data unit pushed into the FIFO memory device, the next available internal data unit being a location to which a next input data unit is to be written; and selecting, using the selection logic circuitry, that one of the internal FIFO memories for connection to a first one of the data inputs and cyclically selecting additional ones of the internal FIFO memories for connection to additional ones of the data inputs to store additional data units in order as the additional data units are pushed into the FIFO memory device.

13. The method of claim 11 wherein the entering the data from the data inputs as stored data units, in the order of receipt, in corresponding storage locations in respective different ones of the internal FIFO memories comprises:

clocking the plurality of internal FIFO memories by a second clock signal having second clock speed, the second clock speed being a multiple of a first clock speed of a first clock signal by which the FIFO memory device is clocked; whereby:

a number of data units equal to a product of the second number and the multiple is entered during one clock cycle of the FIFO memory device.

14. The method of claim 13 wherein the receiving data units, in an order of receipt, into ones of the fourth number of data inputs of the FIFO memory device comprises receiving data units at most equal in number to a product of the second number and the multiple.

15. The method of claim 11 wherein the receiving data units, in an order of receipt, into ones of the fourth number of data inputs of the FIFO memory device comprises receiving data units at most equal in number to the second number.

16. A method of reading data from a first-in, first-out (FIFO) memory device having a first number of data storage units, the FIFO memory device comprising a plurality of internal FIFO memories equal in number to a second number, each internal FIFO memory in the plurality of internal FIFO memories having a third number of internal data storage units in individual storage locations, the first number, which enumerates quantity of data storage units, being a product of the second number and the third number, the method comprising:

using output multiplexer circuitry that is coupled to all of the internal FIFO memories to selectively connect any one of the internal FIFO memories to each data unit of a fourth number of data outputs, reading out stored data units in round-robin fashion across the internal FIFO memories as the stored data units are pushed out of the internal FIFO memories, to data outputs of the FIFO memory device, in an output order corresponding to an order in which the stored data units were received by the FIFO memory device.

17. The method of claim 16 wherein the using output multiplexer circuitry comprises:

using a first multiplexer stage to select a respective one of the individual storage locations in each respective one of the internal FIFO memories as a respective output of that respective one of the internal FIFO memories; and using a second multiplexer stage to connect each respective output of each of the internal FIFO memories in the round-robin fashion, as selected by the first multiplexer stage, to a respective one of the data outputs.

18. The method of claim 17 wherein the using the second multiplexer stage to connect each respective output of each of the internal FIFO memories in the round-robin fashion to a respective one of the data outputs comprises maintaining, in selection logic circuitry, a pointer to one of the internal FIFO memories that stores a next data storage unit to be read out, and selecting, using the selection logic circuitry, that one of the internal FIFO memories following an internal FIFO memory formerly occupied by an immediately previous data unit pushed out of the FIFO memory device for connection to a first one of the data outputs, and cyclically selecting additional ones of the internal FIFO memories for connection to additional ones of the data outputs to read out additional data units in order as the additional data units are pushed out of the FIFO memory device.

19. The method of claim 16 wherein the reading out stored data units in the round-robin fashion across the internal FIFO memories comprises maintaining, in selection logic circuitry, a pointer to one of the internal FIFO memories that stores a next data storage unit to be read out, and selecting, using the selection logic circuitry, that one of the internal FIFO memories following an internal FIFO memory formerly occupied by an immediately previous data unit pushed out of the FIFO memory device for connection to a first one of the data outputs, and cyclically selecting additional ones of the internal FIFO memories for connection to additional ones of the data outputs to read out additional data units in order as the additional data units are pushed out of the FIFO memory device.

20. The method of claim 16 wherein reading out stored data units in the round-robin fashion from the internal FIFO memories, to data outputs of the FIFO memory device, comprises:

clocking the plurality of internal FIFO memories by a second clock signal having second clock speed, the second clock speed being a multiple of a first clock speed of a first clock signal by which the FIFO memory device is clocked; whereby:

a number of data units equal to a product of the second number and the multiple is read out during one clock cycle of the FIFO memory device.

* * * * *